United States Patent
Chao et al.

(10) Patent No.: US 12,265,323 B2
(45) Date of Patent: Apr. 1, 2025

(54) PELLICLE FOR AN EUV LITHOGRAPHY MASK AND A METHOD OF MANUFACTURING THEREOF

(71) Applicant: Taiwan Semiconductor Manufacturing Company, Ltd., Hsinchu (TW)

(72) Inventors: Tzu-Ang Chao, Hsinchu (TW); Chao-Ching Cheng, Hsinchu (TW); Han Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/516,630

(22) Filed: Nov. 21, 2023

(65) Prior Publication Data

US 2024/0094629 A1 Mar. 21, 2024

Related U.S. Application Data

(63) Continuation of application No. 17/576,911, filed on Jan. 14, 2022, now Pat. No. 11,860,534.

(60) Provisional application No. 63/230,555, filed on Aug. 6, 2021.

(51) Int. Cl.
G03F 1/62 (2012.01)
G03F 1/24 (2012.01)
G03F 1/64 (2012.01)

(52) U.S. Cl.
CPC .............. *G03F 1/62* (2013.01); *G03F 1/24* (2013.01); *G03F 1/64* (2013.01)

(58) Field of Classification Search
CPC ..................................... G03F 1/62; G03F 1/64
USPC ............................................................ 430/5
See application file for complete search history.

(56) References Cited

U.S. PATENT DOCUMENTS

| | | | |
|---|---|---|---|
| 10,684,560 B2 | 6/2020 | Shin et al. | |
| 10,712,659 B2 | 7/2020 | Gallagher et al. | |
| 10,928,723 B2 | 2/2021 | Shin et al. | |
| 11,042,085 B2 | 6/2021 | Ono et al. | |
| 11,947,256 B2 | 4/2024 | Kurganova et al. | |
| 2018/0149966 A1 | 5/2018 | Shin et al. | |
| 2018/0329289 A1 | 11/2018 | Gallagher et al. | |
| 2019/0056654 A1 | 2/2019 | Péter et al. | |
| 2019/0390090 A1 | 12/2019 | Kim et al. | |
| 2020/0159107 A1 | 5/2020 | Kurganova et al. | |
| 2020/0272047 A1 | 8/2020 | Chatterjee et al. | |
| 2021/0223683 A1 | 7/2021 | Lee et al. | |
| 2022/0135855 A1 | 5/2022 | Kim et al. | |
| 2023/0037580 A1 | 2/2023 | Chao et al. | |
| 2023/0044415 A1 | 2/2023 | Chao et al. | |
| 2023/0176471 A1 | 6/2023 | Hart et al. | |
| 2023/0205073 A1 | 6/2023 | Chao et al. | |

FOREIGN PATENT DOCUMENTS

| | | |
|---|---|---|
| CN | 108572512 A | 9/2018 |
| CN | 108663898 A | 10/2018 |
| CN | 108873596 A | 11/2018 |
| CN | 110998435 A | 4/2020 |
| JP | 2018-092155 A | 6/2018 |
| JP | 2018-194840 A | 12/2018 |
| JP | 2020-529036 A | 10/2020 |
| TW | 201725178 A | 7/2017 |

OTHER PUBLICATIONS

Jonathan Kim et al., "Synthesis and Characterization of Transition Metal Dichalcogenide and Carbon Nanotube Coaxial Heterostructures," Transfer-to-Excellence Summer Research Program (2017) https://e3s-center.berkeley.edu/education-diversity/education/undergraduate/tte-transfer-excellence-summer-research-program/tte-program-archive-b/2017-2/.

Notice of Allowance issued in U.S. Appl. No. 17/576,911, dated Aug. 22, 2023.

Notice of Allowance issued in U.S. Appl. No. 17/576,911, dated Sep. 25, 2023.

Notice of Allowance issued in U.S. Appl. No. 17/576,911, dated Nov. 7, 2023.

*Primary Examiner* — Christopher G Young

(74) *Attorney, Agent, or Firm* — STUDEBAKER BRACKETT PLLC

(57) ABSTRACT

A pellicle for an EUV photo mask includes a first layer; a second layer; and a main layer disposed between the first layer and second layer and including a plurality of nanotubes. At least one of the first layer or the second layer includes a two-dimensional material in which one or more two-dimensional layers are stacked. In one or more of the foregoing and following embodiments, the first layer includes a first two-dimensional material and the second layer includes a second two-dimensional material.

20 Claims, 12 Drawing Sheets

X-cut scheme

Y-cut scheme

Top-view scheme

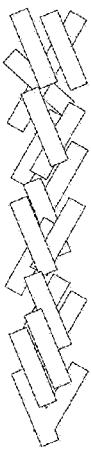
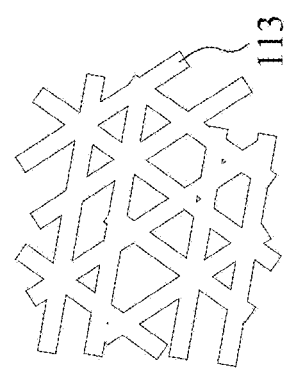
FIG. 2A
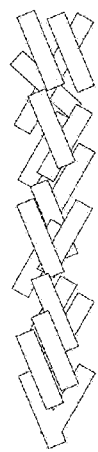
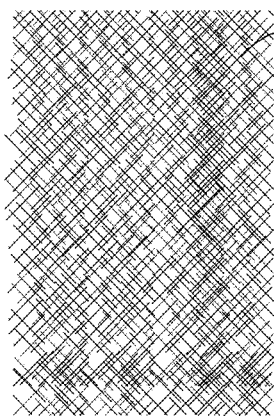
FIG. 2B
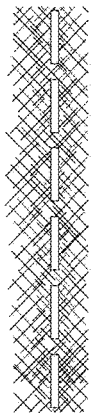
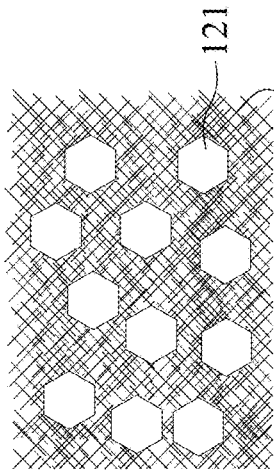
FIG. 2C
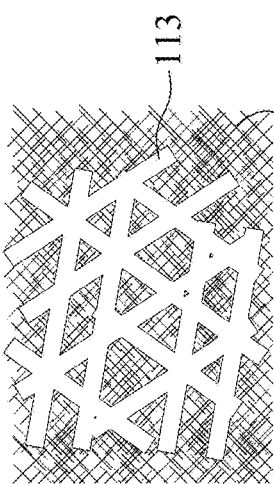
FIG. 2D

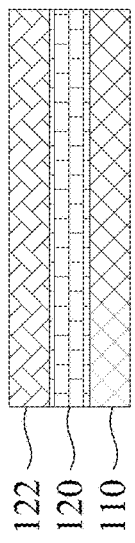
FIG. 3A
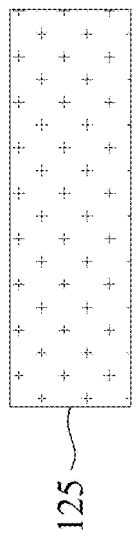
FIG. 3B
FIG. 3C
FIG. 3D
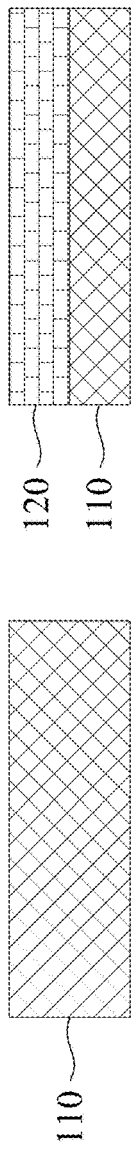
FIG. 3E
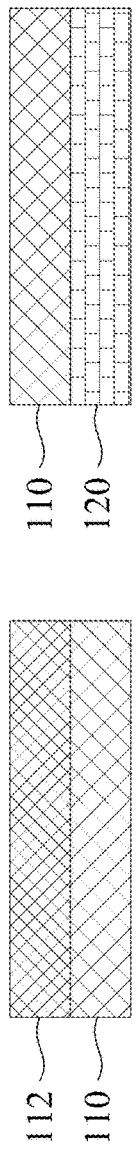
FIG. 3F
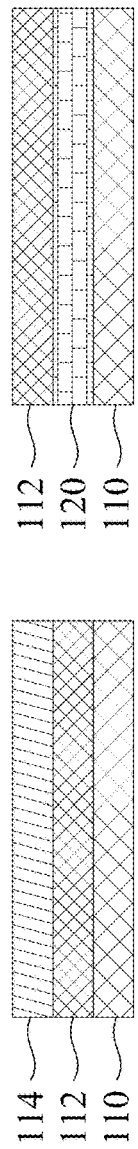
FIG. 3G
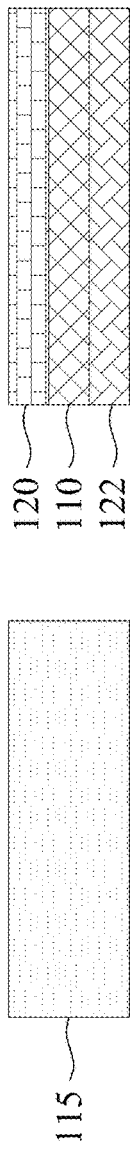
FIG. 3H
FIG. 3I
FIG. 3J cross-sectional scheme cross-sectional scheme
Mixed network film Membrane Top-view scheme Membrane Top-view scheme
Mixed network film cross-section cut

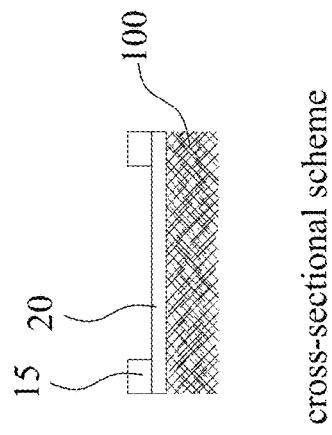
FIG. 10A cross-sectional scheme
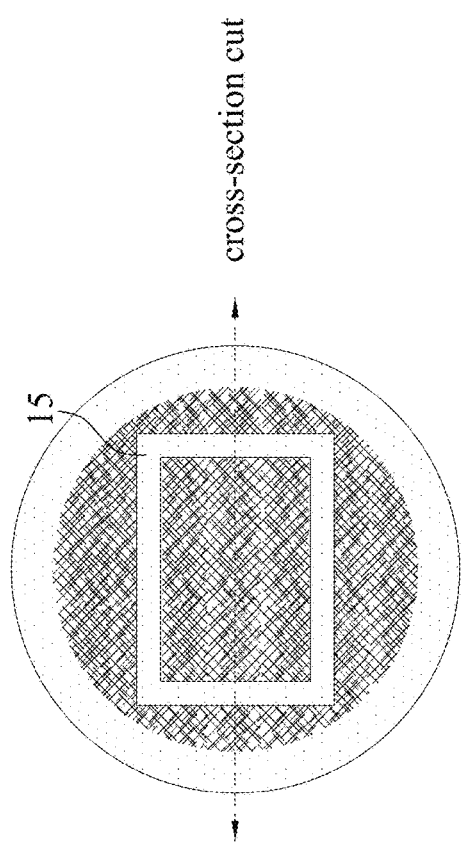
FIG. 10B Top-view scheme
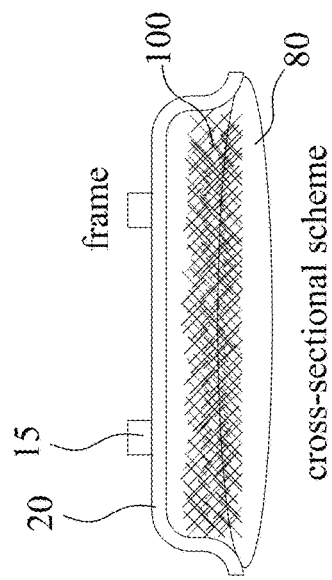
FIG. 9A cross-sectional scheme
FIG. 9B Top-view scheme cross-sectional scheme Top-view scheme cross-sectional scheme Top-view scheme

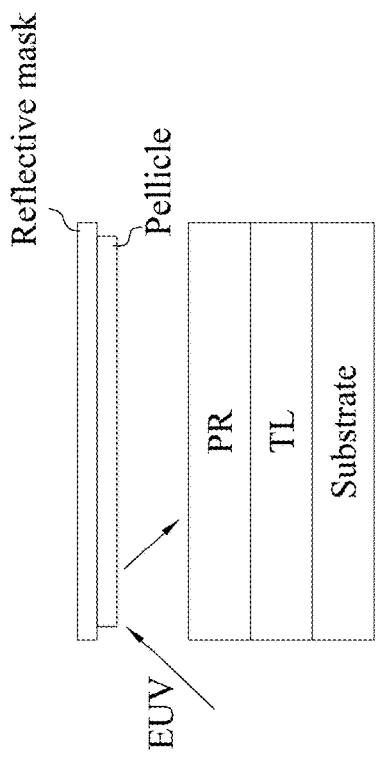
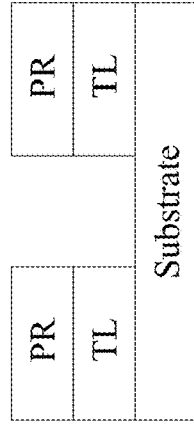
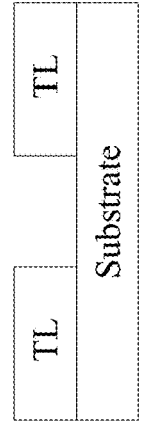
FIG. 13C
FIG. 13D
FIG. 13E
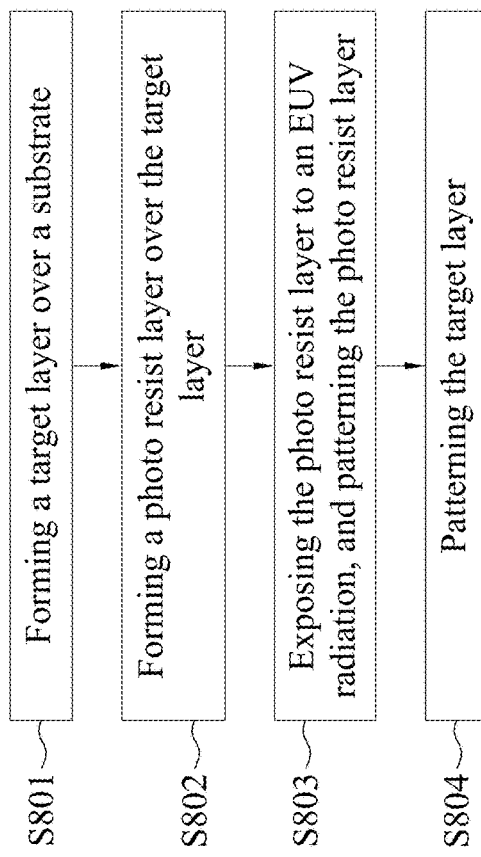
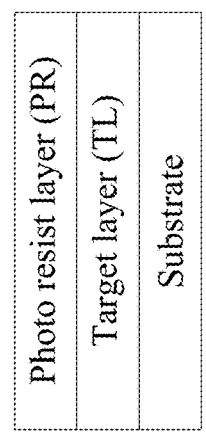
FIG. 13A
FIG. 13B

PELLICLE FOR AN EUV LITHOGRAPHY MASK AND A METHOD OF MANUFACTURING THEREOF

RELATED APPLICATIONS

This application is a continuation application of U.S. patent application Ser. No. 17/576,911, filed Jan. 14, 2022, now U.S. Pat. No. 11,860,534, which claims priority of U.S. Provisional Patent Application No. 63/230,555 filed on Aug. 6, 2021, the entire contents of each of which are incorporated herein by reference.

BACKGROUND

A pellicle is a thin transparent film stretched over a frame that is glued over one side of a photo mask to protect the photo mask from damage, dust and/or moisture. In EUV lithography, a pellicle having a high transparency in the EUV wavelength region, a high mechanical strength and a low thermal expansion is generally required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 2C, 2D, 2E, 2F and 2G show various views of network membranes of a pellicle for an EUV photo mask in accordance with embodiments of the present disclosure.

FIGS. 3A, 3B, 3C, 3D, 3E, 3F, 3G, 3H, 3I and 3J show various views of network membranes of a pellicle for an EUV photo mask in accordance with embodiments of the present disclosure.

FIGS. 9A and 9B show a cross sectional view and a plan (top) view of one of the various stages for manufacturing a pellicle for an EUV photo mask in accordance with an embodiment of the present disclosure.

FIGS. 10A and 10B show a cross sectional view and a plan (top) view of one of the various stages for manufacturing a pellicle for an EUV photo mask in accordance with an embodiment of the present disclosure.

FIG. 13A shows a flowchart of a method making a semiconductor device, and FIGS. 13B, 13C, 13D and 13E show a sequential manufacturing operation of a method of making a semiconductor device in accordance with embodiments of present disclosure.

DETAILED DESCRIPTION

Figure 1A:
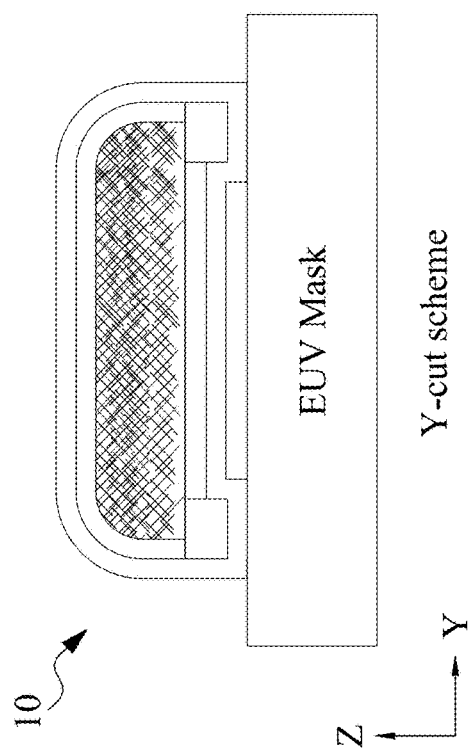
FIGS. 1A, 1B and 1C show various view of a pellicle for an EUV photo mask in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained. Materials, configurations, structures, operations and/or dimensions explained with one embodiment can be applied to other embodiments, and detained description thereof may be omitted.

EUV lithography is one of the crucial techniques for extending Moore's law. However, due to wavelength scaling from 193 nm (ArF) to 13.5 nm, the EUV light source suffered from strong power decay due to environment adsorption. Even though a stepper/scanner chamber is operated under vacuum to prevent the strong EUV adsorption by gas, maintaining a high EUV transmittance from the EUV light source to a wafer is still an important factor in EUV lithography.

A pellicle generally requires a high transparency and a low reflectivity. In UV or DUV lithography, the pellicle film is made of a transparent resin film. In EUV lithography, however, a resin based film would not be acceptable, and a non-organic material, such as a polysilicon, suicide or metal film, is used.

Carbon nanotubes (CNTs) are one of the materials suitable for a pellicle for an EUV reflective photo mask, because CNTs have a high EUV transmittance of more than 96.5%. Generally, a pellicle for an EUV reflective mask requires the following properties: (1) Long life time in a rich hydrogen radical operation environment in an EUV stepper/scanner; (2) Strong mechanical strength to minimize the sagging effect during vacuum pumping and venting operations; (3) A high or perfect blocking property for particles larger than about 20 nm (killer particles); and (4) A good heat dissipation to prevent the pellicle from being burnt out by EUV radiation.

In the present disclosure, a pellicle for an EUV photo mask includes a network membrane having a plurality of nanotubes and a two-dimensional material layer covering the network membrane. Such a pellicle has a high EUV transmittance, improved mechanical strength, blocks killer particles from falling on an EUV mask, and/or has improved durability.

Figure 1B:
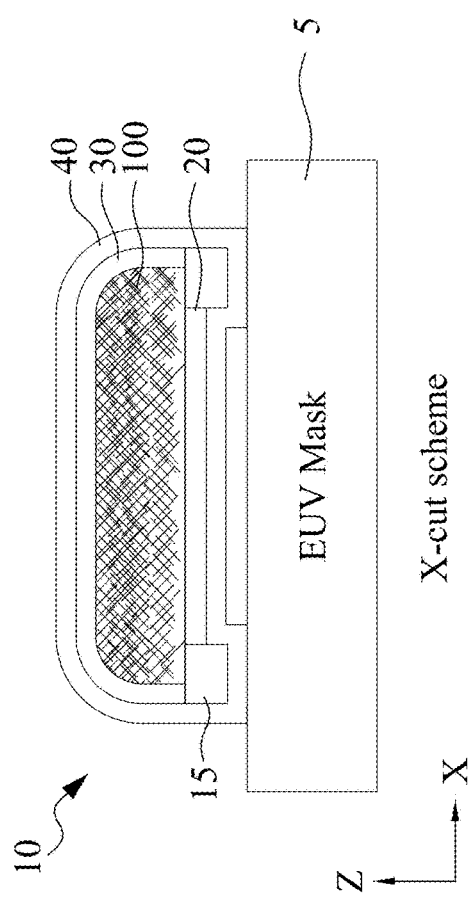
Figure 1C:
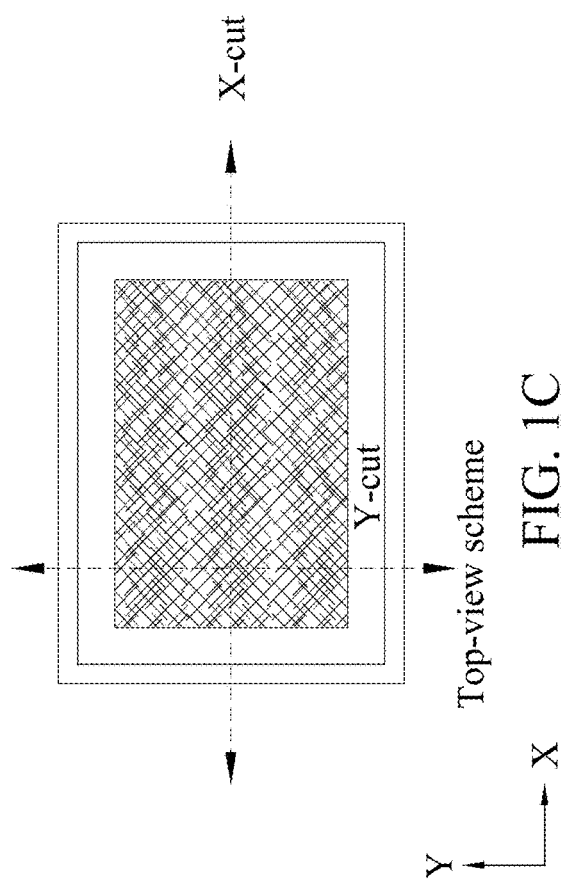

FIGS. 1A, 1B and 1C show an EUV pellicle 10 mounted on an EUV reflective mask 5 in accordance with an embodiment of the present disclosure. FIG. 1A is a cross sectional view in the X direction, FIG. 1B is a cross sectional view in the Y direction, and FIG. 1C is a top (plan) view.

In some embodiments, a pellicle 10 for an EUV reflective mask includes a first cover layer 20, a second cover layer 30 and a main network membrane 100 disposed between the first cover layer 20 and the second cover layer 30. In some embodiments, the main network layer includes a plurality of nanomaterials, such as nanotubes and/or nano-flakes. In some embodiments, a support frame 15 is attached to the first cover layer 20 to maintain a space between the membrane of pellicle and the EUV mask 5 (pattern area) when mounted on the EUV mask 5. One of or both of the first cover layer 20 and the second cover layer 30 include a two-dimensional material in which one or more two-dimensional layers are stacked. Here, a "two-dimensional" layer generally refers to one or a few crystalline layers of an atomic matrix or a network having thickness within the range of about 0.1-5 nm, in some embodiments.

The support frame 15 of the pellicle is attached to the surface of the EUV photo mask 5 with an appropriate bonding material. In some embodiments, the bonding material is an adhesive, such as acrylic or silicon based glue or an A-B cross link type glue. The size of the frame structure is larger than the area of the black borders of the EUV photo mask so that the pellicle covers not only the circuit pattern area of the photo mask but also the black borders.

In some embodiments, the two-dimensional materials of the first cover layer 20 and the second cover layer 30 are the same or different from each other. In some embodiments, the first cover layer includes a first two-dimensional material and the second cover layer includes a second two-dimensional material.

In some embodiments, the two-dimensional material for the first cover layer 20 and/or the second cover layer 30 includes at least one of boron nitride (BN), graphene, and/or transition metal dichalcogenides (TMDs), represented by $MX_2$, where M=Mo, W, Pd, Pt, and/or Hf, and X=S, Se and/or Te. In some embodiments, a TMD is one of $MoS_2$, $MoSe_2$, $WS_2$ or $WSe_2$.

In some embodiments, a total thickness of each of the first cover layer 20 and the second cover layer 30 is in a range from 0.3 nm to 3 nm and is in a range from about 0.5 nm to about 1.5 nm in other embodiments. In some embodiments, a number of the two-dimensional layers of each of the two-dimensional materials of the first and/or second cover layers is 1 to about 20, and is 2 to about 10 in other embodiments. When the thickness and/or the number of layers is greater than these ranges, EUV transmittance of the pellicle 10 may be decreased and when the thickness and/or the number of layers is smaller than these ranges, mechanical strength of the pellicle may be insufficient.

In some embodiments, as shown in FIGS. 1A and 1B, the first cover layer 20 and the second cover layer 30 are sealed at the periphery thereof to fully encapsulate the main network membrane 100. In some embodiments, the first cover layer 20 and the second cover layer 30 form a vacuum sealed structure. In some embodiments, a pressure inside the vacuum sealed structure is about 0.01 Pa to about 100 Pa. If the inside pressure is too high, for example, higher than an inside pressure of an EUV lithography apparatus in operation, the pellicle may rupture due to the pressure difference. In some embodiments, one or more vent holes are formed at the first cover layer 20 and/or the second cover layer 30.

In some embodiments, a protection layer 40 is further disposed over the first cover layer 20, the second cover layer 30 and the support frame 15, as shown in FIGS. 1A and 1B. In some embodiments, the protection layer 40 includes at least one layer of an oxide, such as $HfO_2$, $Al_2O_3$, $ZrO_2$, $Y_2O_3$, or $La_2O_3$. In some embodiments, the protection layer 40 includes at least one layer of non-oxide compounds, such as $B_4C$, YN, $Si_3N_4$, BN, NbN, RuNb, $YF_3$, TiN, or ZrN. In some embodiments, the protection layer 40 includes at least one metal layer made of, for example, Ru, Nb, Y, Sc, Ni, Mo, W, Pt, or Bi. In some embodiments, the protection layer 40 is a single layer, and in other embodiments, two or more layers of these materials are used as the protection layer 40. In some embodiments, a thickness of the protection layer is in a range from 0.1 nm to 5 nm, and is in a range from about 0.2 nm to about 2.0 nm in other embodiments. When the thickness of the protection layer 40 is greater than these ranges, EUV transmittance of the pellicle 10 may be decreased and when the thickness of the protection layer 40 is smaller than these ranges, the mechanical strength of the pellicle may be insufficient.

By using the first and/or second cover layer and/or the protection layer, which do not have holes, such as opening and/or spaces greater than about 10-20 nm, it is possible to fully block killer particles larger than about 20 nm from passing through the main network membrane 100 and falling on the surface of the EUV mask 5.

FIGS. 2A, 2B, 2C, 2D, 2E, 2F and 2G show various network membranes of a pellicle for an EUV photo mask in accordance with embodiments of the present disclosure.

In some embodiments, the network membrane 100 includes a plurality of nanotubes. In some embodiments, the plurality of nanotubes are randomly arranged to form a network structure. In some embodiments, a diameter of each of the plurality of nanotubes is in a range from 0.5 nm to 20 nm and is in a range from about 1 nm to about 10 nm in other embodiments. In some embodiments, a length of each of the plurality of nanotubes is in a range from about 0.5 µm to about 50 µm and is in a range from about 1.0 µm to about 20 µm in other embodiments.

In some embodiments, the plurality of nanotubes are carbon nanotubes, boron nitride nanotubes, and/or TMD nanotubes, where TMD is represented by $MX_2$, where M=Mo, W, Pd, Pt, and/or Hf, and X=S, Se and/or Te. In some embodiments, the plurality of nanotubes are $MoS_2$ nanotubes, $MoSe_2$ nanotubes, $WS_2$ nanotubes or $WSe_2$ nanotubes.

In some embodiments, the plurality of nanotubes include only one type of nanotubes in terms of material and structure. In some embodiments, the plurality of nanotubes include nanotubes of the same material. In some embodiments, the main network membrane 100 only includes single wall nanotubes 111 as shown in FIG. 2A. In other embodiments, the main network membrane 100 only includes multiwall (e.g., double wall) nanotubes 113 as shown in FIG. 2B. A multiwall nanotube includes an inner tube and one or more outer tubes coaxially disposed around the inner tube. In some embodiments, the outer tube is movable along the axial direction with respect to the inner tube and in other embodiments, the outer tube is fixed on the outer surface of the inner tube. In some embodiments, a diameter of each of the single wall nanotubes is in a range from about 0.5 nm to about 5 nm and is in a range from about 1 nm to about 2 nm in other embodiments. In some embodiments, a diameter of each of the multiwall nanotubes is in a range from about 3 nm to about 20 nm and is in a range from about 5 nm to about 10 nm in other embodiments.

In some embodiments, the plurality of nanotubes include two or more types of nanotubes in terms of material and structure. In some embodiments, the plurality of nanotubes include single wall nanotubes made of two or more materials (mixture of different material nanotubes). For example, in some embodiments, the plurality of nanotubes include a plurality of first nanotubes and a plurality of second nanotubes made of different material from the plurality of first nanotubes, and both of them are single wall nanotubes.

In some embodiments, the main network layer 100 includes a plurality of nanotubes 111 which are single wall nanotubes, and a plurality of nanotubes 113 which are multiwall (e.g., double wall) nanotubes as shown in FIG. 2C. In some embodiments, an amount (weight) of the single wall nanotubes 111 is greater than an amount of the multiwall nanotubes 113. In some embodiments, an amount (weight) of the single wall nanotubes 111 is greater than an amount of the multiwall nanotubes 113.

In some embodiments, the plurality of single wall nanotubes 111 are made of a same material as the plurality of multiwall nanotubes 113. For example, the plurality of single wall nanotubes 111 are single wall carbon nanotubes, and the plurality of multiwall nanotubes are multiwall carbon nanotubes. In other embodiments, the plurality of single wall nanotubes 111 are made of a different material as the plurality of multiwall nanotubes 113. For example, the plurality of single wall nanotubes 111 are single wall TMD nanotubes, and the plurality of multiwall nanotubes are multiwall carbon nanotubes. In some embodiments, the plurality of nanotubes are multiple nanotubes made of two or more different materials (mixture of two types of multiwall nanotubes).

Figure 2E:
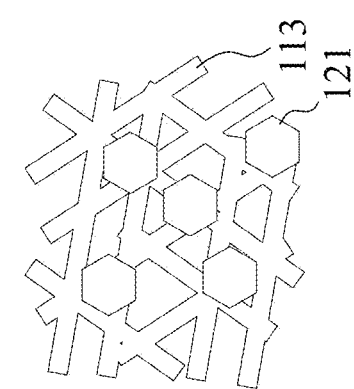
Figure 2F:
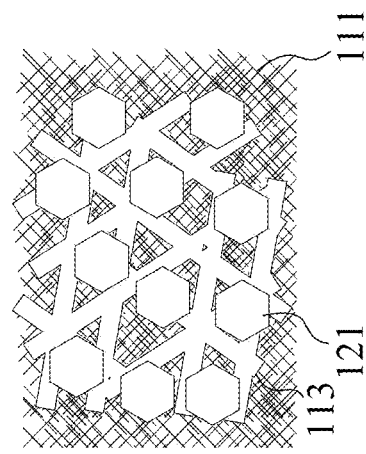

In some embodiments, the main network membrane 100 includes a plurality of nanotubes 111 and a plurality of flakes 121 (nano-flakes) made of a two-dimensional material in which one or more two-dimensional layers are stacked, as shown in FIGS. 2D-2F.

In some embodiments, the two-dimensional material flakes 121 include at least one of boron nitride (BN), graphene, and/or transition metal dichalcogenides (TMDs), represented by $MX_2$, where M=Mo, W, Pd, Pt, and/or Hf, and X=S, Se and/or Te. In some embodiments, a TMD is one of $MoS_2$, $MoSe_2$, $WS_2$ or $WSe_2$.

In some embodiments, a thickness of two-dimensional material flakes 121 is in a range from 0.3 nm to 3 nm and is in a range from about 0.5 nm to about 1.5 nm in other embodiments. In some embodiments, a number of the two-dimensional layers of two-dimensional material flakes 121 is 1 to about 20, and is 2 to about 10 in other embodiments. When the thickness and/or the number of layers is greater than these ranges, EUV transmittance of the pellicle 10 may be decreased and when the thickness and/or the number of layers is smaller than these ranges, mechanical strength of the pellicle may be insufficient.

In some embodiments, the shape of the two-dimensional material flakes 121 is random. In other embodiments, the shape of the two-dimensional material flakes 121 is triangular or hexagonal. In certain embodiments, the shape of the two-dimensional material flakes 121 is a triangle formed by three atoms or a hexagon formed by six atoms. In some embodiments, a size (area) of each of the two-dimensional material flakes 121 is in a range from about 10 $nm^2$ to about 10 $\mu m^2$ and is in a range from about 100 $nm^2$ to about 1 $\mu m^2$ in other embodiments.

In some embodiments, the two-dimensional material flakes 121 are embedded in or mixed with a plurality of single wall nanotubes 111 as shown in FIG. 2D. In some embodiments, the two-dimensional material flakes 121 are embedded in or mixed with a plurality of multiwall nanotubes 113 as shown in FIG. 2E. In some embodiments, the two-dimensional material flakes 121 are embedded in or mixed with a plurality of single wall nanotubes 111 and a plurality of multiwall nanotubes 113, as shown in FIG. 2F.

In some embodiments, an amount (weight) of the two-dimensional material flakes 121 is in a range from about 5% to about 30% with respect to a total weight of the network membrane 100, and is in a range from about 10% to about 20% in other embodiments. When the amount of two-dimensional material flakes is greater than these ranges, the EUV transmittance of the pellicle 10 may be decreased and when the amount of two-dimensional material flakes is smaller than these ranges, the mechanical strength of the pellicle may be insufficient.

Figure 2G:
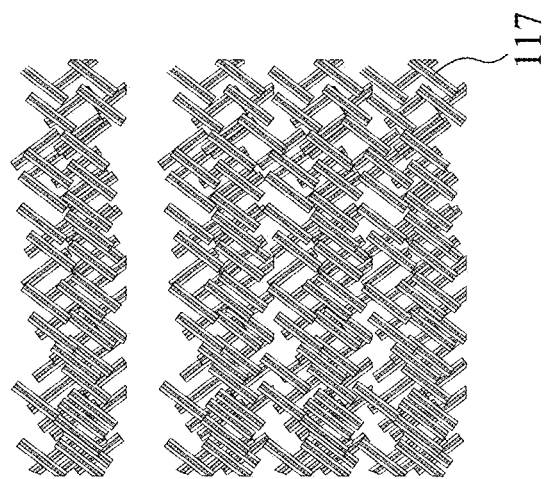

In some embodiments, the network membrane 100 includes multiwall nanotubes 117 each having an inner tube and one or more outer tubes, where the inner tubes and the outer tubes are made of different materials, as shown in FIG. 2G. In some embodiments, each the multiwall nanotubes 117 include an inner tube formed of carbon nanotubes, boron nitride nanotubes, and/or TMD nanotubes, and a coating layer as the outer tubes. In some embodiments, the coating layer includes one of an oxide, such as $HfO_2$, $Al_2O_3$, $ZrO_2$, $Y_2O_3$, or $La_2O_3$; a non-oxide compound, such as $B_4C$, YN, $Si_3N_4$, BN, NbN, RuNb, $YF_3$, TiN, or ZrN; and/or a metal, such as, Ru, Nb, Y, Sc, Ni, Mo, W, Pt, or Bi. In some embodiments, the coating layer is made of the same material as the protection layer 40.

FIGS. 3A, 3B, 3C, 3D, 3E, 3F, 3G, 3H, 3I and 3J show various views of network membranes of a pellicle for an EUV photo mask in accordance with embodiments of the present disclosure. In some embodiments, the network membrane 100 has a single layer structure or a multilayer structure.

In some embodiments, the network membrane 100 has a single layer 110 of a plurality of single or multi wall nanotubes as shown in FIG. 3A. In some embodiments, the network membrane 100 has two layers of different type nanotubes 110 and 112, as shown in FIG. 3B. The thickness of the layer 110 and layer 112 are the same or different from each other. In some embodiments, the network membrane 100 has three layers of nanotubes 110, 112 and 114, as shown in FIG. 3C. At least adjacent layers are different types in some embodiments. The thickness of the layers 110, 112 and 114 are the same or different from each other. In some embodiments, the network membrane 100 has a single layer 115 of a mixture of different type nanotubes, as shown in FIG. 3D.

In some embodiments, the network membrane 100 has a nanotube layer 110 and a two-dimensional flake layer 120, as shown in FIGS. 3E and 3F. The thickness of the layer 110 and layer 120 are the same or different from each other. The layer 110 can be a mixed layer 115 as shown in FIG. 3D. In some embodiments, the network membrane 100 has a two-dimensional flake layer 120 disposed between a first nanotube layer 110 and a second nanotube layer 112, as shown in FIG. 3G. In some embodiments, the first and second nanotube layers are of the same type or different types. In some embodiments, the network membrane 100 has a nanotube layer 110 disposed between a first two-dimensional flake layer 120 and a second two-dimensional flake layer 122, as shown in FIG. 3H. In some embodiments, the first and second two-dimensional flake layers are made of the same material or different materials from each other. In some embodiments, the network membrane 100 has a nanotube layer 110, a first two-dimensional flake layer 120 over the nanotube layer 110 and a second two-dimensional flake layer 122 disposed over the first two-dimensional flake layer 120 as shown in FIG. 3I. In some embodiments, the network membrane 100 has one or more nanotube layers of the same type or different types and one or more two-dimensional flake layers of the same material or different materials. In some embodiments, the network membrane 100 has a single layer 125 of a mixture of nanotubes and two-dimensional flakes, as shown in FIG. 3J.

FIGS. 4A, 4B, 4C, 4D, 4E and 4F show various views of pellicles for an EUV photo mask in accordance with an embodiment of the present disclosure.

Figure 4A:
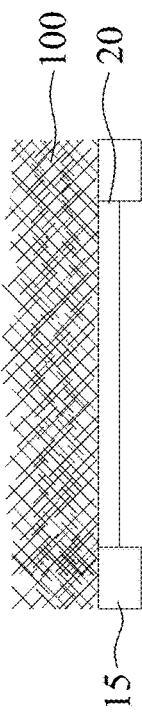
FIGS. 4A, 4B, 4C, 4D, 4E and 4F show various views of pellicles for an EUV photo mask in accordance with an embodiment of the present disclosure.
Figure 4B:
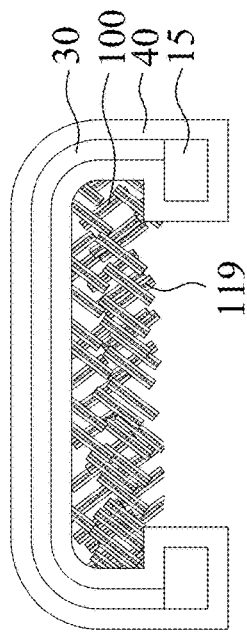
Figure 4C:
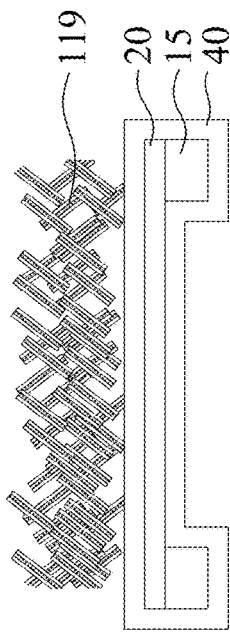
Figure 4D:
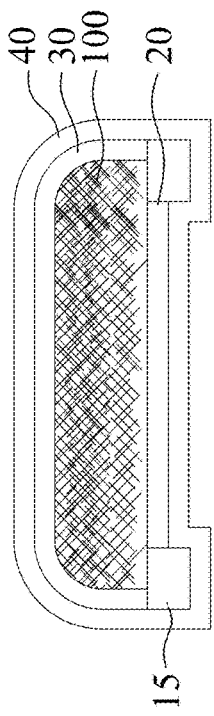
Figure 4E:
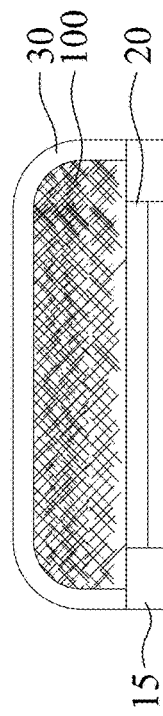
Figure 4F:
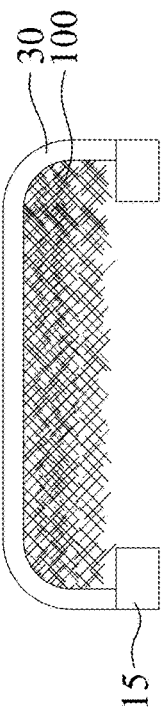

FIG. 4A is the same as FIGS. 1A-1C. In some embodiments, a pellicle does not include a protection layer as shown in FIG. 4B. In some embodiments, the first cover layer is not used and only the second cover layer 30 is disposed over the main network membrane 100 as shown in FIG. 4C. In some embodiments, the second cover layer is not used and only the first cover layer 20 is disposed over the main network membrane 100 as shown in FIG. 4D. In some embodiments, the first cover layer is not used and only the second cover layer 30 is disposed over the main network membrane 100 and a protection layer 40 is formed on the second cover layer and network membrane 100 forming covered network layer 119 as shown in FIG. 4E. In some embodiments, the second cover layer is not used and only the first cover layer 20 is disposed over the main network membrane 100 and a protection layer 40 is formed on the first cover layer and network membrane 100 forming covered network layer 119 as shown in FIG. 4F.

Figure 5B:
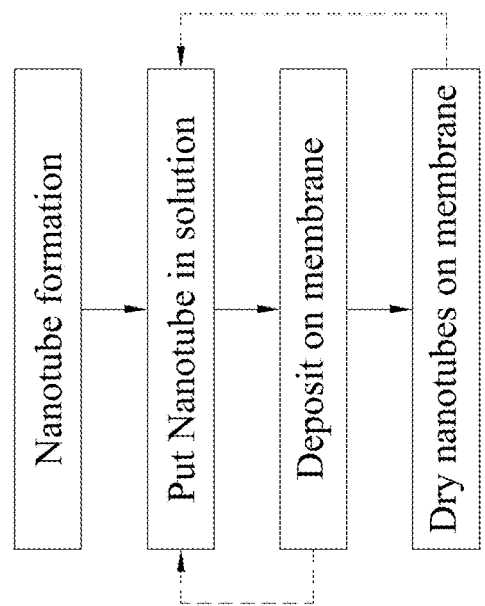
FIG. 5A shows a manufacturing process of a network membrane and FIG. 5B shows a flow chart thereof in accordance with an embodiment of the present disclosure.
Figure 5A:
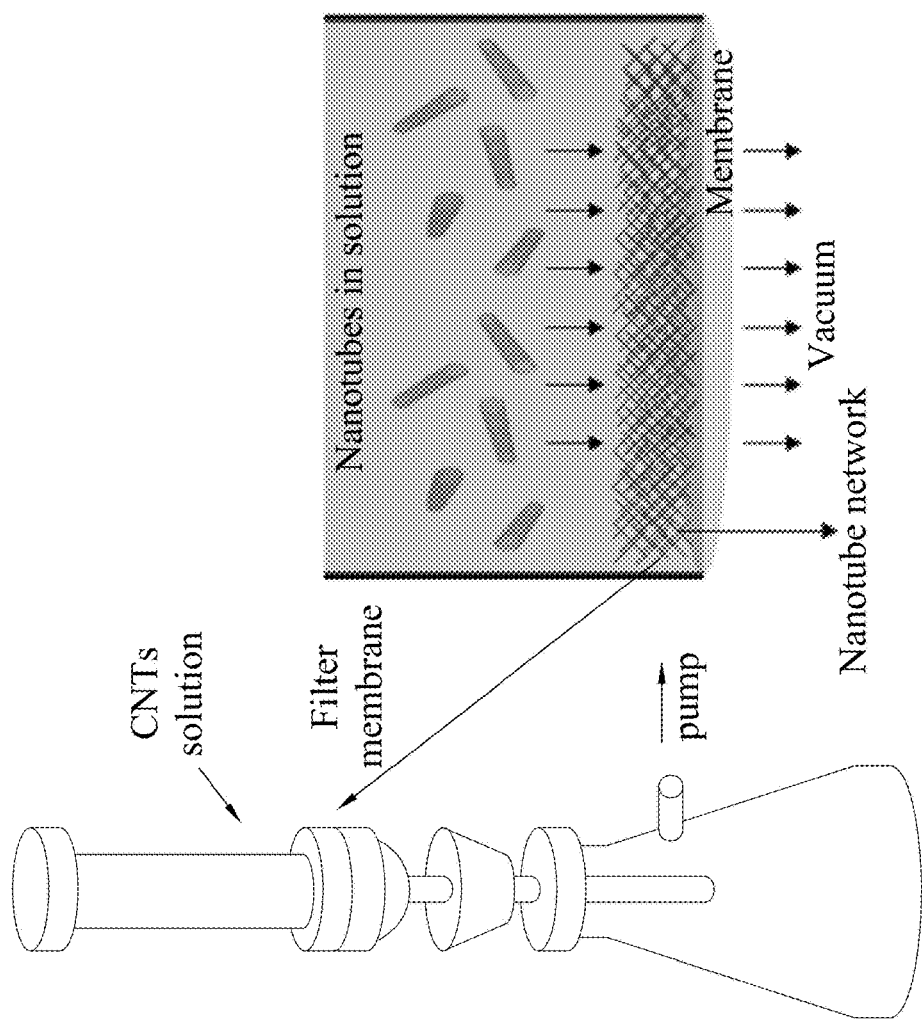

FIG. 5A shows a manufacturing process of a network membrane and FIG. 5B shows a flow chart thereof in accordance with an embodiment of the present disclosure.

In some embodiments, nanotubes are dispersed in a solution as shown in FIG. 5A. In some embodiments, nanotubes are carbon nanotubes formed by various methods, such as arc-discharge, laser ablation or chemical vapor deposition (CVD) methods. Similarly, BN nanotubes and TMD nanotubes are also formed by a CVD process. The solution is a solvent including water or an organic solvent such as sodium dodecyl sulfate (SDS). The nanotubes are one type or two or more types of nanotubes (material and/or wall structure).

As shown in FIG. 5A, a support membrane is placed between a chamber or a cylinder in which the nanotube dispersed solution is disposed and a vacuum chamber. In some embodiments, the support membrane is an organic or inorganic porous or mesh material. In some embodiments, the support membrane is woven or non-woven fabric. In some embodiments, the support membrane has a circular shape in which a pellicle size or a 150 mm×150 mm square (the size of an EUV mask) can be placed.

As shown in FIG. 5A, the pressure in the vacuum chamber is reduced so that a pressure is applied to the solvent in the chamber or cylinder. Since the mesh or pore size of the support membrane is sufficiently smaller than the size of the nanotubes, the nanotubes are captured by the support membrane while the solvent passes through the support membrane. The support membrane on which the nanotubes are deposited is detached from the filtration apparatus of FIG. 5A and then is dried. In some embodiments, the deposition by filtration is repeated so as to obtain a desired thickness of the nanotube network layer as shown in FIG. 5B. In some embodiments, after the deposition of the nanotubes in the solution, other nanotubes are dispersed in the same or new solution and the filter-deposition is repeated. In other embodiments, after the nanotubes are dried, another filter-deposition is performed. In the repetition, the same type of nanotubes is used in some embodiments, and different types of nanotubes are used in other embodiments.

Figure 6:
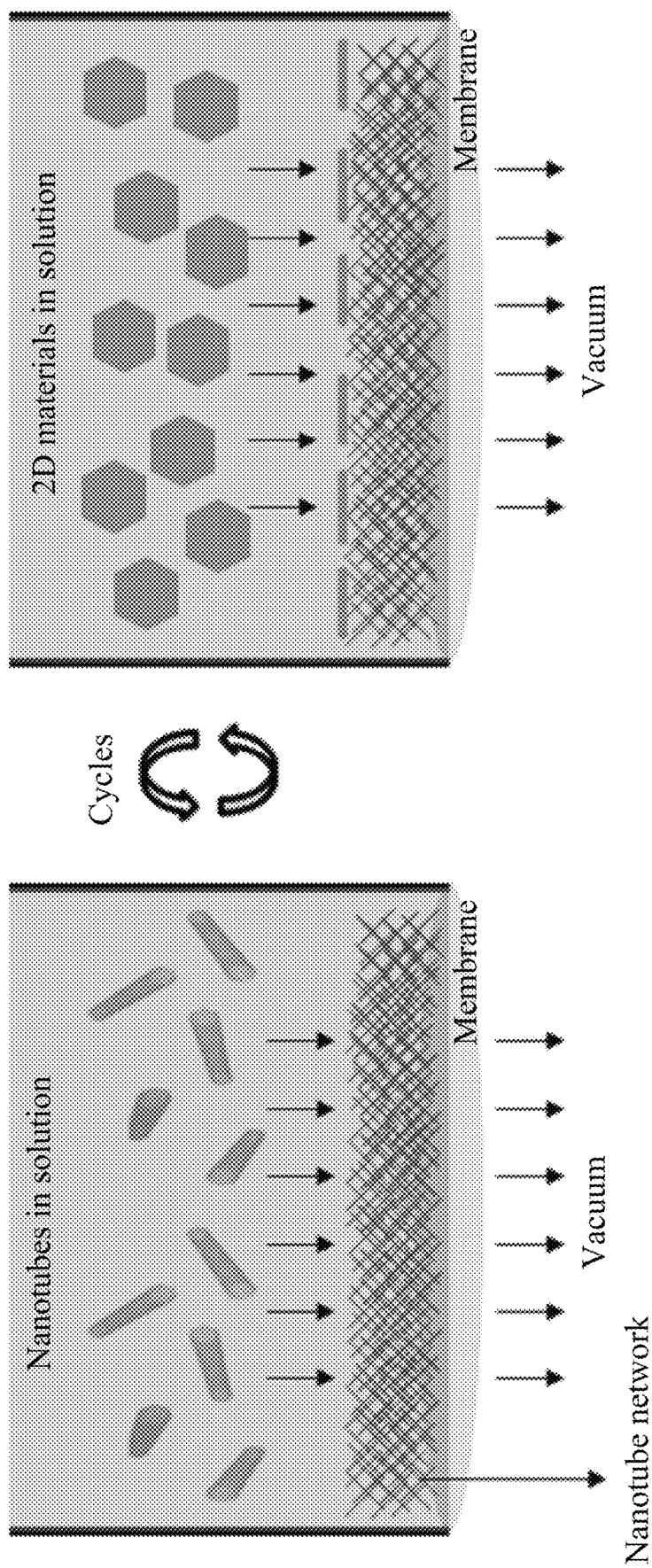
FIG. 6 shows a manufacturing process of a network membrane in accordance with an embodiment of the present disclosure.

FIG. 6 shows a manufacturing process of a network membrane in accordance with an embodiment of the present disclosure. When the main network membrane 100 includes nanotubes and two-dimensional material flakes, the deposition by filtration for nanotubes and the deposition by filtration for the flakes are repeated as shown in FIG. 6. In some embodiments, a mixture of nanotubes and flakes are dispersed in the solvent, and the deposition by filtration is performed to form a mixed network layer of nanotubes and two-dimensional material flakes.

Two-dimensional material layer(s) are formed over a substrate by a CVD method, and then the deposited layer is peeled off from the substrate. After the two-dimensional material layer is peeled off, the layer is crushed into flakes in some embodiments.

FIGS. 7A and 7B to 12A and 12B show cross sectional views (the "A" figures) and plan (top) views (the "B" figures) of the various stages for manufacturing a pellicle for an EUV photo mask in accordance with an embodiment of the present disclosure. It is understood that additional operations can be provided before, during, and after the processes shown by FIGS. 7A-12B, and some of the operations described below can be replaced or eliminated, for additional embodiments of the method. The order of the operations/processes may be interchangeable.

Figure 8A:
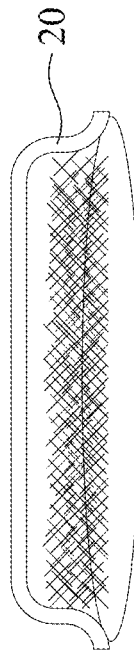
FIGS. 8A and 8B show a cross sectional view and a plan (top) view of one of the various stages for manufacturing a pellicle for an EUV photo mask in accordance with an embodiment of the present disclosure.
Figure 7A:
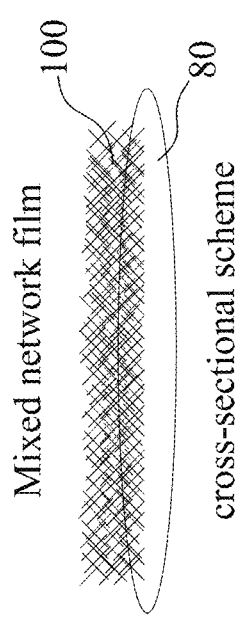
FIGS. 7A and 7B show a cross sectional view and a plan (top) view of one of the various stages for manufacturing a pellicle for an EUV photo mask in accordance with an embodiment of the present disclosure.
Figure 8B:
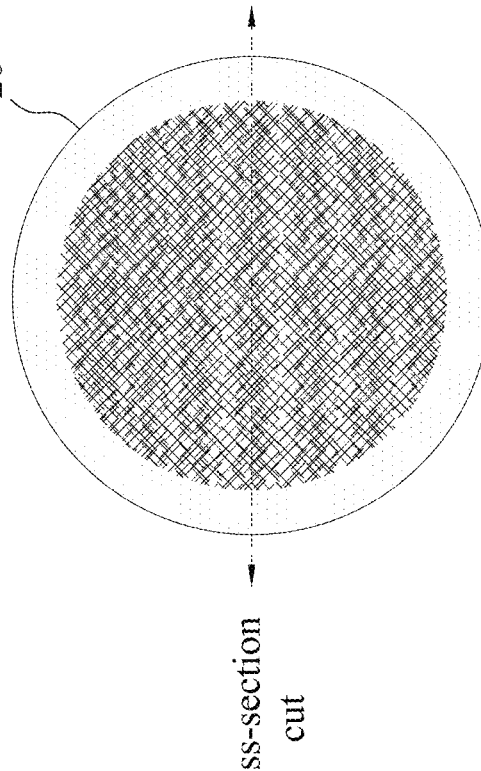
Figure 7B:
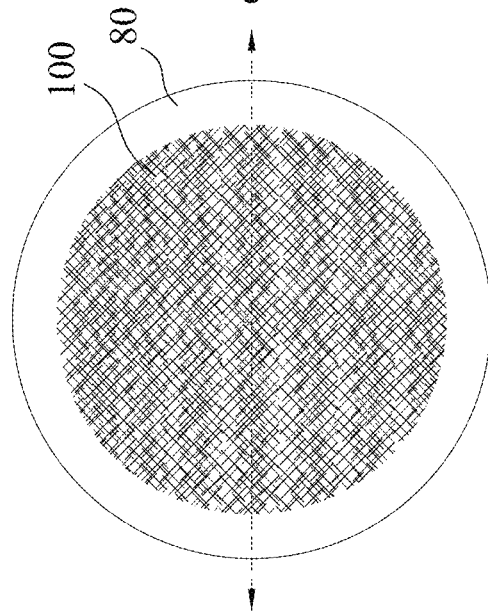

As shown in FIG. 5A, 5B or 6, a main network membrane 100 is formed on a support membrane 80 by deposition by filtering. The main network membrane 100 is then detached from a deposition apparatus, as shown in FIGS. 7A and 7B. Then, as shown in FIGS. 8A and 8B, a first cover layer 20 is formed over the main network membrane 100 in some embodiments.

The first cover layer 20, which is a two-dimensional material, is formed by, for example, a CVD method on a substrate, and then the deposited two-dimensional layer(s) is peeled off from the substrate. The peeled two-dimensional layer(s) is subsequently transferred over the main network layer 100 formed on the support substrate 80, as shown in FIGS. 8A and 8B.

In some embodiments, a TMD layer represented by $MX_2$ is formed by CVD. In some embodiments, a $MoS_2$ layer is formed by CVD using source gases, such as a $Mo(CO)_6$ gas, a $MoCl_5$ gas, and/or a $MoOCl_4$ gas as a Mo source; and a $H_2S$ gas and/or a dimethylsulfide gas as a S source. In other embodiments, a $MO_3$ gas sublimed from a solid $MO_3$ or a $MoCl_5$ source and/or S gas is sublimed from a solid S source. Solid sources of Mo and S are placed in a reaction chamber and a carrier gas containing inert gas, such as Ar, $N_2$ and/or He flows in the reaction chamber. The solid sources are heated to generate gaseous sources by sublimation, and the generated gaseous sources react to form $MoS_2$ molecules. The $MoS_2$ molecules are then deposited on the substrate. The substrate is appropriately heated in some embodiments. In other embodiments, the entire reaction chamber is heated by induction heating. Other TMD layers can also be formed by CVD using suitable source gases. For example, metal oxides, such as $WO_3$, $PdO_2$ and $PtO_2$ can be used as a sublimation source for W, Pd and Pt, respectively, and metal compounds, such as $W(CO)_6$, $WF_6$, $WOCl_4$, $PtCl_2$ and $PdCl_2$ can be used as a metal source. In some embodiments, the substrate on which the TMD two-dimensional layer is formed, includes one of Si (110), $\gamma$-$Al_2O_3$ (110), $Ga_2O_3$ (010) or MgO (110). In other embodiments, a layer of hexagonal boron nitride (h-BN) or graphene is formed as the first cover layer 20 over a substrate by CVD. In some embodiments, the substrate includes one of SiC (0001), Si (111), or Ge (111).

Then, as shown in FIGS. 9A and 9B, a support frame 15 is attached to the first cover layer 20. In some embodiments, the support frame 15 is formed of one or more layers of crystalline silicon, polysilicon, silicon oxide, silicon nitride, ceramic, metal or organic material. In some embodiments, as shown in FIG. 9B, the support frame 15 has a rectangular (including square) frame shape, which is larger than the black border area of an EUV mask and smaller than the substrate of the EUV mask.

Next, as shown in FIGS. 10A and 10B, the first cover layer 20, the main network membrane 100 and the support membrane 80 are cut into a rectangular shape having the same size as or slightly larger than the support frame 15, and then the support substrate 80 is detached or removed, in some embodiments. When the support substrate 80 is made of an organic material, the support substrate 80 is removed by wet etching using an organic solvent.

Figure 11C:
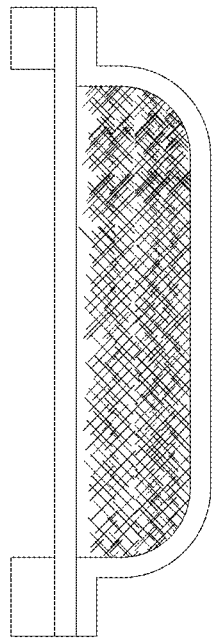
FIGS. 11C and 11D show cross sectional views of one of the various stages for manufacturing a pellicle for an EUV photo mask in accordance with embodiments of the present disclosure.
Figure 11D:
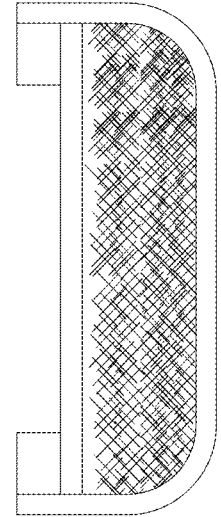
Figure 11A:
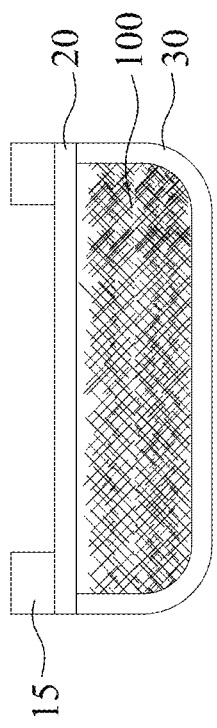
FIGS. 11A and 11B show a cross sectional view and a plan (top) view of one of the various stages for manufacturing a pellicle for an EUV photo mask in accordance with an embodiment of the present disclosure.
Figure 11B:
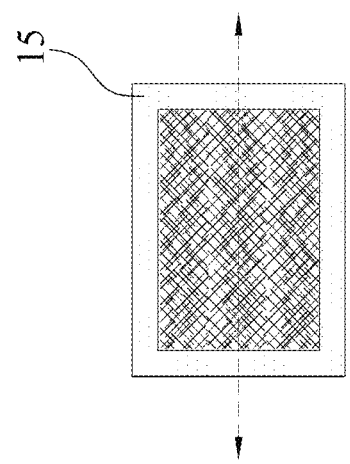

Further, as shown in FIGS. 11A and 11B, a second cover layer 30 is formed over the main network membrane 100. The operations for forming the second cover layer 30, which is a two-dimensional material, is the same as or similar to those for the first cover layer 20 as set forth above. In some embodiments, the first cover layer 20 and the second cover layer 30 are sealed at the periphery thereof to fully encapsulate the main network membrane 100.

In some embodiments, the second cover layer 30 has a flange portion at which the second cover layer 30 is fixed or bonded to the first cover layer 20, as shown in FIG. 11C. In other embodiments, the second cover layer 30 is attached to the sides of the first cover layer 20 and the support frame 15 as shown in FIG. 11D.

Figure 12A:
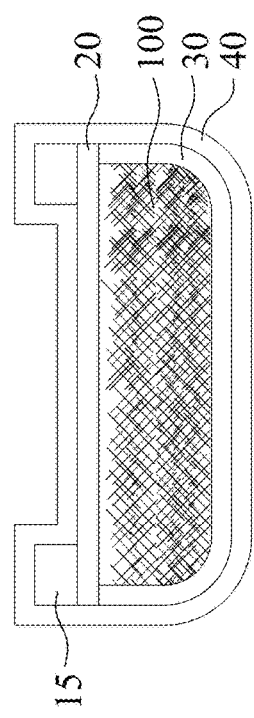
FIGS. 12A and 12B show a cross sectional view and a plan (top) view of one of the various stages for manufacturing a pellicle for an EUV photo mask in accordance with an embodiment of the present disclosure.
Figure 12B:
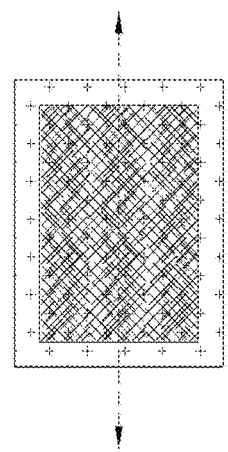

Further, as shown in FIGS. 12A and 12B, a protection layer 40 is formed over the first cover layer 20, the second cover layer and the support frame 15. In some embodiments, the protection layer 40 is formed by CVD, physical vapor deposition (PVD) or atomic layer deposition (ALD).

FIG. 13A shows a flowchart of a method of making a semiconductor device, and FIGS. 13B, 13C, 13D and 13E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S801 of FIG. 13A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S802, of FIG. 13A, a photo resist layer is formed over the target layer, as shown in FIG. 13B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer. At S803 of FIG. 13A, the photo resist layer is patterned using an EUV reflective mask with a pellicle as set forth above, as shown in FIG. 13B. The patterning of the photo resist layer includes performing a photolithography exposing process by an EUV exposing system using the EUV mask. During the exposing process, the integrated circuit (IC) design pattern defined on the EUV mask is imaged to the photo resist layer to form a latent pattern thereon. The patterning of the photo resist layer further includes developing the exposed photo resist layer to form a patterned photo resist layer having one or more openings. In one embodiment where the photo resist layer is a positive tone photo resist layer, the exposed portions of the photo resist layer are removed during the developing process. The patterning of the photo resist layer may further include other process steps, such as various baking steps at different stages. For example, a post-exposure-baking (PEB) process may be implemented after the photolithography exposing process and before the developing process.

At S804 of FIG. 13A, the target layer is patterned utilizing the patterned photo resist layer as an etching mask, as shown in FIG. 13D. In some embodiments, the patterning the target layer includes applying an etching process to the target layer using the patterned photo resist layer as an etch mask. The portions of the target layer exposed within the openings of the patterned photo resist layer are etched while the remaining portions are protected from etching. Further, the patterned photo resist layer may be removed by wet stripping or plasma ashing, as shown in FIG. 13E.

The pellicles according to embodiments of the present disclosure provide a higher strength and thermal conductivity (dissipation) as well as higher EUV transmittance than conventional pellicles. In the foregoing embodiments, two or more types of nanotubes are used as a main network membrane to increase the mechanical strength of the pellicle and obtain a high EUV transmittance. Further, a two-dimensional material layer is used as a cover layer (first and/or second cover layers) and/or used together with nanotubes to increase the mechanical strength of a pellicle. In addition, by using a two-dimensional material layer and/or a protection layer enclose the main network membrane, it is possible to increase the mechanical strength of the pellicle and provide a high or perfect blocking property of killer particles. Moreover, the use of the two-dimensional material improves heat dissipation to prevent a pellicle from being burnt out by EUV radiation in some embodiments.

It will be understood that not all advantages have been necessarily discussed herein, no particular advantage is required for all embodiments or examples, and other embodiments or examples may offer different advantages.

In accordance with one aspect of the present disclosure, a pellicle for an EUV photo mask includes a first layer; a second layer; and a main layer disposed between the first layer and second layer and including a plurality of nanotubes. At least one of the first layer or the second layer includes a two-dimensional material in which one or more two-dimensional layers are stacked. In one or more of the foregoing and following embodiments, the first layer includes a first two-dimensional material and the second layer includes a second two-dimensional material. In one or more of the foregoing and following embodiments, each of the first and second two-dimensional materials includes at least one selected from the group consisting of boron nitride (BN), graphene, $MoS_2$, $MoSe_2$, $WS_2$, and $WSe_2$. In one or more of the foregoing and following embodiments, the first two-dimensional material is different from the second two-dimensional material. In one or more of the foregoing and following embodiments, a thickness of each of the first layer and the second layer is in a range from 0.3 nm to 3 nm. In one or more of the foregoing and following embodiments, a number of the one or more two-dimensional layers of each of the first and second two-dimensional materials is 1 to 20. In one or more of the foregoing and following embodiments, the first layer and the second layer are sealed to fully encapsulate the main layer. In one or more of the foregoing and following embodiments, the pellicle further includes a protection layer disposed over the first layer and the second layer. In one or more of the foregoing and following embodiments, the protection layer includes at least one selected from the group consisting of $HfO_2$, $Al_2O_3$, $ZrO_2$, $Y_2O_3$, and $La_2O_3$. In one or more of the foregoing and following embodiments, the protection layer includes at least one selected from the group consisting of $B_4C$, YN, $Si_3N_4$, BN, NbN, RuNb, $YF_3$, TiN, and ZrN. In one or more of the foregoing and following embodiments, the protection layer includes a metal layer made of at least one selected from the group consisting of Ru, Nb, Y, Sc, Ni, Mo, W, Pt, and Bi. In one or more of the foregoing and following embodiments, a thickness of the protection layer is in a range from 0.1 nm to 5 nm. In one or more of the foregoing and following embodiments, a diameter of each of the plurality of nanotubes is in a range from 0.5 nm to 20 nm.

In accordance with another aspect of the present disclosure, a pellicle for an extreme ultraviolet (EUV) reflective mask includes a first layer; a second layer; and a main layer disposed between the first layer and second layer. The main layer includes a plurality of first nanotubes and a plurality of second nanotubes different from the plurality of first nanotubes. In one or more of the foregoing and following embodiments, at least one of the first layer or the second layer includes a two-dimensional material in which one or more two-dimensional layers are stacked. In one or more of the foregoing and following embodiments, the plurality of first nanotubes are single wall nanotubes and the plurality of second nanotubes are multiwall nanotubes. In one or more of the foregoing and following embodiments, the plurality of first nanotubes are made of a same material as the plurality of second nanotubes. In one or more of the foregoing and following embodiments, the plurality of first nanotubes are made of a different material than the plurality of second nanotubes. In one or more of the foregoing and following embodiments, each of the plurality of first nanotubes and the plurality of second nanotubes are one or more selected from the group consisting of carbon nanotubes, boron nitride nanotubes, $MoS_2$ nanotubes, $MoSe_2$ nanotubes, $WS_2$ nanotubes and $WSe_2$ nanotubes. In one or more of the foregoing and following embodiments, both the plurality of first nanotubes and the plurality of second nanotubes are single wall nanotubes. In one or more of the foregoing and following embodiments, both the plurality of first nanotubes and the plurality of second nanotubes are multiwall nanotubes. In one or more of the foregoing and following embodiments, the plurality of first nanotubes are single wall nanotubes and the plurality of second nanotubes are multiwall nanotubes.

In accordance with another aspect of the present disclosure, a pellicle for an extreme ultraviolet (EUV) reflective mask includes a first layer; a second layer; and a main layer disposed between the first layer and second layer. The main layer includes a plurality of nanotubes and a plurality of flakes comprising two-dimensional material in which one or more two-dimensional layers are stacked. In one or more of the foregoing and following embodiments, the two-dimensional material includes at least one selected from the group consisting of boron nitride (BN), graphene, $MoS_2$, $MoSe_2$, $WS_2$, and $WSe_2$. In one or more of the foregoing and following embodiments, a size of each of the plurality of flakes is in a range from 100 $nm^2$ to 100 $\mu m^2$. In one or more of the foregoing and following embodiments, a thickness of each of the plurality of flakes is in a range from 0.3 nm to 3 nm. In one or more of the foregoing and following embodiments, a number of the one or more two-dimensional layers of each of the plurality of flakes is 1 to 20.

In accordance with another aspect of the present disclosure, a pellicle for an extreme ultraviolet (EUV) reflective mask includes a first membrane; a support frame attached to the first membrane; and a main layer disposed over the first layer and including a plurality of nanotubes. The first membrane includes a two-dimensional material in which one or more two-dimensional layers are stacked. In one or more of the foregoing and following embodiments, the two-dimensional material of the first membranes includes at least one selected from the group consisting of boron nitride (BN), graphene, $MoS_2$, $MoSe_2$, $WS_2$, and $WSe_2$. In one or more of the foregoing and following embodiments, a thickness of the first membrane is in a range from 0.3 nm to 3 nm. In one or more of the foregoing and following embodiments, a number of the one or more two-dimensional layers of the first membrane is 1 to 20. In one or more of the foregoing and following embodiments, the first membrane is disposed between the support frame and the main layer. In one or more of the foregoing and following embodiments, a part of the main layer is disposed between the first membrane and the support frame. In one or more of the foregoing and following embodiments, the pellicle further includes a protection layer disposed over both sides of the first membrane. In one or more of the foregoing and following embodiments, the protection layer includes at least one selected from the group consisting of $HfO_2$, $Al_2O_3$, $ZrO_2$, $Y_2O_3$, and $La_2O_3$. In one or more of the foregoing and following embodiments, the protection layer includes at least one selected from the group consisting of $B_4C$, YN, $Si_3N_4$, BN, NbN, RuNb, $YF_3$, TiN, and ZrN. In one or more of the foregoing and following embodiments, the protection layer includes a metal layer made of at least one selected from the group consisting of Ru, Nb, Y, Sc, Ni, Mo, W, Pt, and Bi. In one or more of the foregoing and following embodiments, a thickness of the protection layer is in a range from 0.1 nm to 5 nm. In one or more of the foregoing and following embodiments, the protection layer is also formed to cover the plurality of nanotubes of the main layer. In one or more of the foregoing and following embodiments, the plurality of nanotubes include a plurality of first nanotubes and a plurality of second nanotubes different from the plurality of first nanotubes. In one or more of the foregoing and following embodiments, the plurality of first nanotubes are single wall nanotubes and the plurality of second nanotubes are multiwall nanotubes. In one or more of the foregoing and following embodiments, the plurality of first nanotubes are made of a same material as the plurality of second nanotubes. In one or more of the foregoing and following embodiments, the plurality of first nanotubes are made of a different material than the plurality of second nanotubes. In one or more of the foregoing and following embodiments, each of the plurality of first nanotubes and the plurality of second nanotubes are one or more selected from the group consisting of carbon nanotubes, boron nitride nanotubes, $MoS_2$ nanotubes, $MoSe_2$ nanotubes, $WS_2$ nanotubes and $WSe_2$ nanotubes. In one or more of the foregoing and following embodiments, both the plurality of first nanotubes and the plurality of second nanotubes are single wall nanotubes. In one or more of the foregoing and following embodiments, both the plurality of first nanotubes and the plurality of second nanotubes are multiwall nanotubes. In one or more of the foregoing and following embodiments, the plurality of first nanotubes are single wall nanotubes and the plurality of second nanotubes are multiwall nanotubes. In one or more of the foregoing and following embodiments, the main layer further includes a plurality of flakes comprising two-dimensional material in which one or more two-dimensional layers are stacked. In one or more of the foregoing and following embodiments, the two-dimensional material includes at least one selected from the group consisting of boron nitride (BN), graphene, $MoS_2$, $MoSe_2$, $WS_2$, and $WSe_2$. In one or more of the foregoing and following embodiments, a size of each of the plurality of flakes is in a range from 100 $nm^2$ to 100 $\mu m^2$. In one or more of the foregoing and following embodiments, a thickness of each of the plurality of flakes is in a range from 0.3 nm to 3 nm. In one or more of the foregoing and following embodiments, a number of the one or more two-dimensional layers of each of the plurality of flakes is 1 to 20.

In accordance with another aspect of the present disclosure, in a method of manufacturing a pellicle for an extreme ultraviolet (EUV) reflective mask, a nanotube layer is formed over a support substrate, a first cover layer is formed over the nanotube layer, a pellicle frame is attached over the first cover layer, the nanotube layer and the first cover layer are cut to form a cut pellicle membrane, a second layer is formed to fully encapsulate the nanotube layer of the cut pellicle membrane by sealing with the first layer of the cut pellicle membrane, and a protection layer is formed over the first cover layer, the second cover layer and a pellicle frame. In one or more of the foregoing and following embodiments, at least one of the first cover layer or the second cover layer includes a two-dimensional material in which one or more two-dimensional layers are stacked. In one or more of the foregoing and following embodiments, the first cover layer includes a first two-dimensional material and the second cover layer includes a second two-dimensional material. In one or more of the foregoing and following embodiments, each of the first and second two-dimensional materials includes at least one selected from the group consisting of boron nitride (BN), graphene, $MoS_2$, $MoSe_2$, $WS_2$, and $WSe_2$. In one or more of the foregoing and following embodiments, the first two-dimensional material is different from the second two-dimensional material. In one or more of the foregoing and following embodiments, a thickness of each of the first cover layer and the second cover layer is in a range from 0.3 nm to 3 nm. In one or more of the foregoing and following embodiments, a number of the one or more two-dimensional layers of each of the first and second two-dimensional materials is 1 to 20. In one or more of the foregoing and following embodiments, the protection layer includes at least one selected from the group consisting of $HfO_2$, $Al_2O_3$, $ZrO_2$, $Y_2O_3$, and $La_2O_3$. In one or more of the foregoing and following embodiments, the protection layer includes at least one selected from the group consisting of $B_4C$, YN, $Si_3N_4$, BN, NbN, RuNb, $YF_3$, TiN, and ZrN. In one or more of the foregoing and following embodiments, the protection layer includes a metal layer made of at least one selected from the group consisting of Ru, Nb, Y, Sc, Ni, Mo, W, Pt, and Bi. In one or more of the foregoing and following embodiments, a thickness of the protection layer is in a range from 0.1 nm to 5 nm. In one or more of the foregoing and following embodiments, the nanotube layer includes a plurality of nanotubes having a diameter in a range from 0.5 nm to 20 nm. In one or more of the foregoing and following embodiments, the plurality of nanotubes include a plurality of first nanotubes and a plurality of second nanotubes different from the plurality of first nanotubes. In one or more of the foregoing and following embodiments, at least one of the first layer or the second layer includes a two-dimensional material in which one or more two-dimensional layers are stacked. In one or more of the foregoing and following embodiments, the plurality of first nanotubes are single wall nanotubes and the plurality of second nanotubes are multiwall nanotubes. In one or more of the foregoing and following embodiments, the plurality of first nanotubes are made of a same material as the plurality of second nanotubes. In one or more of the foregoing and following embodiments, the plurality of first nanotubes are made of a different material than the plurality of second nanotubes. In one or more of the foregoing and following embodiments, each of the plurality of first nanotubes and the plurality of second nanotubes are one or more selected from the group consisting of carbon nanotubes, boron nitride nanotubes, $MoS_2$ nanotubes, $MoSe_2$ nanotubes, $WS_2$ nanotubes and $WSe_2$ nanotubes. In one or more of the foregoing and following embodiments, both the plurality of first nanotubes and the plurality of second nanotubes are single wall nanotubes. In one or more of the foregoing and following embodiments, both the plurality of first nanotubes and the plurality of second nanotubes are multiwall nanotubes. In one or more of the foregoing and following embodiments, the plurality of first nanotubes are single wall nanotubes and the plurality of second nanotubes are multiwall nanotubes. In one or more of the foregoing and following embodiments, the nanotube layer includes a plurality of nanotubes and a plurality of flakes comprising two-dimensional material in which one or more two-dimensional layers are stacked. In one or more of the foregoing and following embodiments, the two-dimensional material includes at least one selected from the group consisting of boron nitride (BN), graphene, $MoS_2$, $MoSe_2$, $WS_2$, and $WSe_2$. In one or more of the foregoing and following embodiments, a size of each of the plurality of flakes is in a range from 100 nm$^2$ to 100 µm$^2$. In one or more of the foregoing and following embodiments, a thickness of each of the plurality of flakes is in a range from 0.3 nm to 3 nm. In one or more of the foregoing and following embodiments, a number of the one or more two-dimensional layers of each of the plurality of flakes is 1 to 20.

In accordance with another aspect of the present disclosure, in a method of manufacturing a EUV pellicle, a network structure of nanotubes is formed, a two-dimensional (2D) material layer is formed over the network structure of nanotubes, and a protection layer is formed over the network structure of nanotubes. In one or more of the foregoing and following embodiments, when the network structure of nanotubes is formed, a first network structure of first nanotubes is formed, and a second network structure of second nanotubes is formed over the first network structure of first nanotubes. In one or more of the foregoing and following embodiments, the first nanotubes are different from the second nanotubes. In one or more of the foregoing and following embodiments, when the network structure of nanotubes is formed,
a third network structure of 2D material flakes is formed over the first network structure of first nanotubes. In one or more of the foregoing and following embodiments, the 2D material flakes are different from the first nanotubes and the second nanotubes. In one or more of the foregoing and following embodiments, the third network structure of 2D material flakes is formed over the first network structure of first nanotubes prior to forming the second network structure of second nanotubes over the first network structure of first nanotubes. In one or more of the foregoing and following embodiments, the forming the third network structure of 2D material flakes over the first network structure of first nanotubes is after forming the second network structure of second nanotubes over the first network structure of first nanotubes. In one or more of the foregoing and following embodiments, forming the 2D material layer over the network structure of nanotubes is prior to forming the protection layer over the network structure of nanotubes. In one or more of the foregoing and following embodiments, forming the 2D material layer over the network structure of nanotubes is after forming the protection layer over the network structure of nanotubes.

In accordance with another aspect of the present disclosure, in a method of manufacturing a EUV pellicle, nanostructures are formed, the nanostructures are dispersed into a solution, a main membrane is formed by filtering the nanostructures by a support membrane, a first two-dimensional layer is formed over a first side of the main membrane, the support membrane is removed, and a second two-dimensional layer is formed over a second side of the main membrane from which the support membrane is removed. In one or more of the foregoing and following embodiments, the nanostructures include nanotubes. In one or more of the foregoing and following embodiments, the nanostructures further include flakes of one or more two-dimensional materials. In one or more of the foregoing and following embodiments, the support membrane is porous. In one or more of the foregoing and following embodiments, a support frame is attached on the first two-dimensional layer. In one or more of the foregoing and following embodiments, a protection layer is formed over the first two-dimensional layer, second two-dimensional layer and the support frame.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an EUV pellicle, comprising:
    forming a network structure of nanotubes;
    forming a 2D material layer over the network structure of nanotubes; and
    forming a protection layer over the network structure of nanotubes.

2. The method of claim 1, wherein the forming the network structure of nanotubes comprises:
    forming a first network structure of first nanotubes; and
    forming a second network structure of second nanotubes over the first network structure of first nanotubes, wherein the first nanotubes are different from the second nanotubes.

3. The method of claim 2, wherein the first nanotubes are single wall nanotubes and the second nanotubes are multi-wall nanotubes.

4. The method of claim 2, wherein the first nanotubes are made of a different material than the second nanotubes.

5. The method of claim 2, wherein the forming the network structure of nanotubes further comprises:
    forming a third network structure of 2D material flakes over the first network structure of first nanotubes, wherein the 2D material flakes are made of a different material than the first nanotubes and the second nanotubes.

6. The method of claim 5, wherein the forming the third network structure of 2D material flakes over the first network structure of first nanotubes is prior to the forming the second network structure of second nanotubes over the first network structure of first nanotubes.

7. The method of claim 5, wherein the forming the third network structure of 2D material flakes over the first network structure of first nanotubes is after the forming the second network structure of second nanotubes over the first network structure of first nanotubes.

8. The method of claim 1, wherein the 2D material includes at least one selected from the group consisting of boron nitride (BN), graphene, $MoS_2$, $MoSe_2$, $WS_2$, and $WSe_2$.

9. The method of claim 1, wherein the protection layer includes at least one selected from the group consisting of $HfO_2$, $Al_2O_3$, $ZrO_2$, $Y_2O_3$, $La_2O_3$, $B_4C$, YN, $Si_3N_4$, BN, NbN, RuNb, $YF_3$, TiN, ZrN, Ru, Nb, Y, Sc, Ni, Mo, W, Pt, and Bi.

10. A method of manufacturing an EUV pellicle, comprising:
    forming nanostructures;
    dispersing the nanostructures into a solution;
    forming a main membrane by filtering the nanostructures using a support membrane;
    forming a first two-dimensional layer over a first side of the main membrane;
    removing the support membrane; and forming a second two-dimensional layer over a second side of the main membrane from which the support membrane is removed.

11. The method of claim 10, wherein the nanostructures include nanotubes.

12. The method of claim 11, wherein the nanotubes include a plurality of first nanotubes and a plurality of second nanotubes different from the plurality of first nanotubes.

13. The method of claim 12, wherein the plurality of first nanotubes are single wall nanotubes and the plurality of second nanotubes are multiwall nanotubes.

14. The method of claim 12, wherein the plurality of first nanotubes are made of a different material than the plurality of second nanotubes.

15. The method of claim 12, wherein the nanostructures further include flakes of one or more two-dimensional materials.

16. The method of claim 15, wherein the two-dimensional material includes at least one selected from the group consisting of boron nitride (BN), graphene, $MoS_2$, $MoSe_2$, $WS_2$, and $WSe_2$.

17. The method of claim 10, further comprising:
attaching a support frame on the first two-dimensional layer; and
forming a protection layer over the first two-dimensional layer, second two-dimensional layer and the support frame.

18. A pellicle for an extreme ultraviolet (EUV) reflective mask, comprising:
a first layer;
a second layer; and
a main layer disposed between the first layer and second layer,
wherein the main layer includes a plurality of nanotubes and a plurality of flakes comprising a two-dimensional material in which one or more two-dimensional layers are stacked.

19. The pellicle of claim 18, wherein the two-dimensional material includes at least one selected from the group consisting of boron nitride (BN), graphene, $MoS_2$, $MoSe_2$, $WS_2$, and $WSe_2$.

20. The pellicle of claim 18, wherein the plurality of nanotubes include a plurality of first nanotubes and a plurality of second nanotubes different from the plurality of first nanotubes.

* * * * *